United States Patent
Zhang et al.

(10) Patent No.: US 10,466,600 B2
(45) Date of Patent: Nov. 5, 2019

(54) OVERLAY ALIGNMENT DETECTION APPARATUS FOR DISPLAY DEVICE AND EXPOSURE PROCESS SYSTEM

(71) Applicants: BOE TECHNOLOGY GROUP CO., LTD., Beijing (CN); BEIJING BOE OPTOELECTRONICS TECHNOLOGY CO., LTD., Beijing (CN)

(72) Inventors: Lei Zhang, Beijing (CN); Wukun Dai, Beijing (CN); Lei Chen, Beijing (CN); Jiapeng Li, Beijing (CN); Yiping Dong, Beijing (CN)

(73) Assignees: BOE TECHNOLOGY GROUP CO., LTD., Beijing (CN); BEIJING BOE OPTOELECTRONICS TECHNOLOGY CO., LTD., Beijing (CN)

( * ) Notice: Subject to any disclaimer, the term of this patent is extended or adjusted under 35 U.S.C. 154(b) by 18 days.

(21) Appl. No.: 15/509,484

(22) PCT Filed: Jun. 8, 2016

(86) PCT No.: PCT/CN2016/085253
§ 371 (c)(1),
(2) Date: Mar. 7, 2017

(87) PCT Pub. No.: WO2017/161701
PCT Pub. Date: Sep. 28, 2017

(65) Prior Publication Data
US 2018/0095371 A1  Apr. 5, 2018

(30) Foreign Application Priority Data

Mar. 23, 2016  (CN) .................. 2016 2 0226332 U

(51) Int. Cl.
*G03F 9/00* (2006.01)
*G03F 7/20* (2006.01)
(Continued)

(52) U.S. Cl.
CPC .......... *G03F 9/7038* (2013.01); *G02F 1/1303* (2013.01); *G03F 7/20* (2013.01);
(Continued)

(58) Field of Classification Search
CPC ........ G03F 9/7038; G03F 9/7088; G03F 7/20; G03F 7/70466; G03F 9/7076;
(Continued)

(56) References Cited

U.S. PATENT DOCUMENTS 5,658,418 A * 8/1997 Coronel ............ H01J 37/32935
156/345.25
5,793,472 A   8/1998 Hori et al.
(Continued)

FOREIGN PATENT DOCUMENTS

CN    101263433 A    9/2008
CN    101981512 A    2/2011
(Continued)

OTHER PUBLICATIONS

Espacenet English translation of CN 102736280.*
(Continued)

*Primary Examiner* — Mohamed K Amara
(74) *Attorney, Agent, or Firm* — Kinney & Lange, P.A.

(57) ABSTRACT

An overlay alignment detection apparatus for a display device and an exposure process system are provided, the overlay alignment detection apparatus including a bearing frame for bearing the display device, a control circuit, a detection assembly and an analysis circuit. The control circuit is to send control commands to the detection assembly depending on pre-stored coordinate information of a reference point within an overlay area of the display device in response to the bearing frame being at an idle time among processes; the detection assembly is to be moved to the overlay area on the bearing frame according to the control commands sent by the control circuit, to acquire images of the overlay area, and to send the acquired images to the analysis circuit; and the analysis circuit is to analyze and process an overlay alignment condition of the display device, with the images sent by the detection assembly.

11 Claims, 2 Drawing Sheets

(51) Int. Cl.
*H01L 21/68* (2006.01)
*H05K 1/02* (2006.01)
*H05K 3/00* (2006.01)
*H01L 27/12* (2006.01)
*G02F 1/13* (2006.01)

(52) U.S. Cl.
CPC ........ *G03F 7/70466* (2013.01); *G03F 9/7069* (2013.01); *G03F 9/7076* (2013.01); *G03F 9/7088* (2013.01); *H01L 21/681* (2013.01); *H01L 27/1214* (2013.01); *H05K 1/0269* (2013.01); *H05K 3/0008* (2013.01)

(58) Field of Classification Search
CPC .. G03F 9/7069; H05K 1/0269; H05K 3/0008; H01L 21/681
See application file for complete search history.

(56) References Cited

U.S. PATENT DOCUMENTS

| | | | | |
|---|---|---|---|---|
| 6,752,900 B2* | 6/2004 | Tesauro | ................ | G03F 7/40 118/719 |
| 8,085,385 B2* | 12/2011 | Kanaya | ............... | G03F 7/70725 355/72 |
| 8,134,688 B2* | 3/2012 | Shibazaki | ........... | G03F 7/70725 355/68 |
| 8,252,491 B2* | 8/2012 | Van Haren | .......... | G03F 7/70633 430/22 |
| 8,264,669 B2* | 9/2012 | Shibazaki | ........... | G03F 7/70508 355/72 |
| 8,514,395 B2* | 8/2013 | Shibazaki | ........... | G03F 7/70725 356/401 |
| 8,760,629 B2* | 6/2014 | Shibazaki | ........... | G03F 7/70341 355/72 |
| 9,207,549 B2* | 12/2015 | Shibazaki | ........... | G03F 7/70725 |
| 9,229,333 B2* | 1/2016 | Shibazaki | ........... | G03F 7/70425 |
| 9,297,773 B2* | 3/2016 | Adhiprakasha | ...... | G01N 23/223 |
| 9,423,705 B2* | 8/2016 | Shibazaki | ............. | G03F 9/7003 |
| 9,760,021 B2* | 9/2017 | Shibazaki | ........... | G03F 7/70725 |
| 9,857,697 B2* | 1/2018 | Shibazaki | ............. | G03F 9/7003 |
| 9,958,792 B2* | 5/2018 | Shibazaki | ........... | G03F 7/70725 |
| 9,983,486 B2* | 5/2018 | Shibazaki | ........... | G03F 7/70725 |
| 10,109,453 B2* | 10/2018 | Stevens | ..................... | G03F 7/20 |
| 10,170,274 B2* | 1/2019 | Stevens | ................ | H01J 37/222 |
| 2005/0042523 A1* | 2/2005 | Wu | ........................ | G03F 1/00 430/5 |
| 2008/0088843 A1* | 4/2008 | Shibazaki | ............. | G03F 9/7003 356/399 |
| 2008/0210977 A1* | 9/2008 | Okita | .................. | H01L 29/7371 257/197 |
| 2010/0140816 A1* | 6/2010 | Van Haren | .......... | G03F 7/70633 257/797 |
| 2017/0010529 A1* | 1/2017 | Aoyagi | ............. | G02F 1/133514 |
| 2017/0025247 A1* | 1/2017 | Stevens | ................ | H01J 37/222 |
| 2017/0330876 A1* | 11/2017 | Leedy | ................. | H01L 27/0688 |
| 2018/0088474 A1* | 3/2018 | Shibazaki | ............. | G03F 9/7088 |

FOREIGN PATENT DOCUMENTS

| | | |
|---|---|---|
| CN | 102736280 A | 10/2012 |
| CN | 103165501 A | 6/2013 |
| JP | 2010045099 A | 2/2010 |

OTHER PUBLICATIONS

International Search Report and Written Opinion (including English translation of Box V) dated Dec. 19, 2016, for corresponding PCT Application No. PCT/CN2016/085253.

* cited by examiner

OVERLAY ALIGNMENT DETECTION APPARATUS FOR DISPLAY DEVICE AND EXPOSURE PROCESS SYSTEM

CROSS-REFERENCE TO RELATED APPLICATION

This application claims the benefit of Chinese Patent Application No. 201620226332.6 filed on Mar. 23, 2016 in the State Intellectual Property Office of China, the whole disclosure of which is incorporated herein by reference.

BACKGROUND OF THE INVENTION

Field of the Invention

Embodiments of the present disclosure relate to the technical field of a processing technology for a display devices, and in particular to an overlay alignment detection apparatus for a display device and an exposure process system.

Description of the Related Art

During a manufacturing process of a display device, a plurality of layers of membrane material may be typically attached onto a glass substrate sequentially, and an overlay alignment relative to a first layer of metal membrane material (i.e., a first membrane layer deposited onto the glass substrate) may be implemented on various layers of membrane material, and the overlay accuracies of the various layers of membrane material may embody quality rating of overlay alignment among the various layers of membrane material.

A specific method for detection of the overlay accuracy among the various layers of membrane material is: after the first layer of metal membrane material is prepared, a reference mark (e.g., a reference mark in a form of a square shape or a box shape) for the overlay alignment of the various layers of membrane material is attached on the first layer of metal membrane material; and then the overlay accuracy of each layer of membrane material formed sequentially is determined by detecting an overlay alignment condition between a peripheral frame thereof and the reference mark.

During the process of implementing above detection of the overlay accuracy, critical dimensions of each layer of membrane material and the first layer of metal membrane material are required to be measured so as to feedback a relative position relationship between each layer of membrane material and the reference mark on the first layer of metal membrane material. Since it takes a long time to measure such critical dimensions, it is infeasible to detect the overlay alignment conditions of all display devices during a practical manufacturing process thereof; then the detection is typically implemented by a spot test or a sampling test, such that an overlay accuracy of 100% may not be guaranteed for all display devices, resulting in adverse effect on product quality.

SUMMARY OF THE INVENTION

Embodiments of the present disclosure have been made to overcome or alleviate at least one aspect of the above mentioned disadvantages and/or shortcomings, there are provided an overlay alignment detection apparatus for a display device and an exposure process system comprising the overlay alignment detection apparatus, both of which may determine the overlay alignment condition of the display device without measuring critical dimensions of the display device; therefore, detection efficiency may be enhanced, such that a comprehensive detection may be implemented on all display devices to be detected and product quality thereof may also be improved.

In order to achieve the purposes of the present disclosure, according to an aspect of the exemplary embodiment of the present application, an overlay alignment detection apparatus for a display device is provided, comprising a bearing frame for bearing the display device, a control device, a detection device and an analysis device, wherein, the control device is configured to send control commands to the detection device depending on pre-stored coordinate information of a reference point within an overlay area of the display device when the bearing frame is at an idle time among processes; the detection device is configured to be moved to the overlay area of the display device on the bearing frame according to the control commands sent by the control device, to acquire images of the overlay area, and to send the acquired images to the analysis device; and the analysis device is configured to analyze and process an overlay alignment condition of the display device, with the images sent by the detection device.

According to an embodiment of the disclosure, the analysis device is configured to display the images for determining the overlay alignment condition of the display device by visual inspection.

According to an embodiment of the disclosure, the analysis device is configured to implement a comparison between the images and an overlay standard image stored in the display device and to determine the overlay alignment condition of the display device on the basis of the results of the comparison.

According to an embodiment of the disclosure, the overlay alignment detection apparatus further comprises an alarm device, which is configured to send out an alarm prompt when the analysis device determines that the overlay alignment condition of the display device is unqualified.

According to an embodiment of the disclosure, the detection device comprises: a mechanical arm, a camera which is mounted on the mechanical arm and acquires the images; and a drive mechanism configured to drive the mechanical arm to move such that the camera is moved to a level above the bearing frame, opposite to the overlay area of the display device.

According to an embodiment of the disclosure, the camera comprises an auto-focusing device configured to perform auto-focusing depending on ambient light and a distance between the camera and the display device.

According to an embodiment of the disclosure, the bearing frame comprises a plurality of layers of trays disposed to be spaced apart one another in a vertical direction, each layer of which is configured to carry a plurality of the display devices. And the drive mechanism comprises: a horizontal drive assembly configured to drive the mechanical arm to move in a horizontal direction; and a vertical drive assembly configured to drive both the horizontal drive assembly and the mechanical arm to move synchronously in a vertical direction.

According to an embodiment of the disclosure, the horizontal drive assembly drives the mechanical arm to move in the horizontal direction into a gap between any two adjacent layers of trays and located to be opposite to the overlay area of the display device, when the vertical drive assembly drives both the horizontal drive assembly and the mechanical arm to move in the vertical direction to a level corresponding to the gap.

According to an embodiment of the disclosure, the horizontal drive assembly drives the mechanical arm in motion in a screw-in or screw-out manner, or the vertical drive assembly drives the mechanical arm in motion in a stretching or retracting manner.

According to an embodiment of the disclosure, the drive mechanism further comprises a rotary mechanism which is mounted onto the horizontal drive assembly and configured to drive the mechanical arm to rotate within a horizontal plane.

According to an embodiment of the disclosure, the detection device comprises two cameras which are spaced apart horizontally and mounted onto the mechanical arm, with a space therebetween conforming to another space between two adjacent display devices on each layer of the trays.

According to an embodiment of the disclosure, the idle time among processes is a time period during which the bearing frame is being in transit or during an awaiting process, after an exposure process while prior to an etching process.

As another technical solution, according to another aspect of the exemplary embodiment of the present application, an exposure process system is provided, comprising an exposure unit, a drying unit and the overlay alignment detection apparatus provided as above by the disclosure. The exposure unit is configured to implement an exposure process on the display device; the drying unit is configured to dry the exposed display device; and the overlay alignment detection apparatus is configured to detect the overlay alignment condition of the dried display device.

The embodiments of the disclosure are provided with following beneficial technical effects:

The overlay alignment detection apparatus for a display device as provided by the embodiments of the disclosure utilizes the control device to send control commands to the detection device depending on coordinate information of a reference point within an overlay area of the display device when the bearing frame is at an idle time among processes; utilizes the detection device which is configured to be moved to the overlay area of the display device on the bearing frame on the basis of the control commands sent by the control device, to acquire images of the overlay area, and to send the acquired images to the analysis device; and then utilizes the analysis device to determine an overlay alignment condition of the display device. As such, without measuring critical dimensions of the display device, detection efficiency may be enhanced, such that a comprehensive detection may be implemented on all display devices to be detected, resulting in an enhanced monitoring level and an improved product quality.

By the overlay alignment detection apparatus for a display device provided by the embodiments of the disclosure, the exposure process system provided by the embodiments of the disclosure may enhance detection efficiency, such that a comprehensive detection may be implemented on all display devices to be detected, resulting in an enhanced monitoring level and an improved product quality.

BRIEF DESCRIPTION OF THE DRAWINGS

The above and other features and advantages of the present disclosure will become more apparent and a more comprehensive understanding of the present disclosure may be obtained, by describing in detail exemplary embodiments disclosure thereof with reference to the accompanying drawings, in which.

DETAILED DESCRIPTION OF PREFERRED EMBODIMENTS OF THE INVENTION

Figure 1:
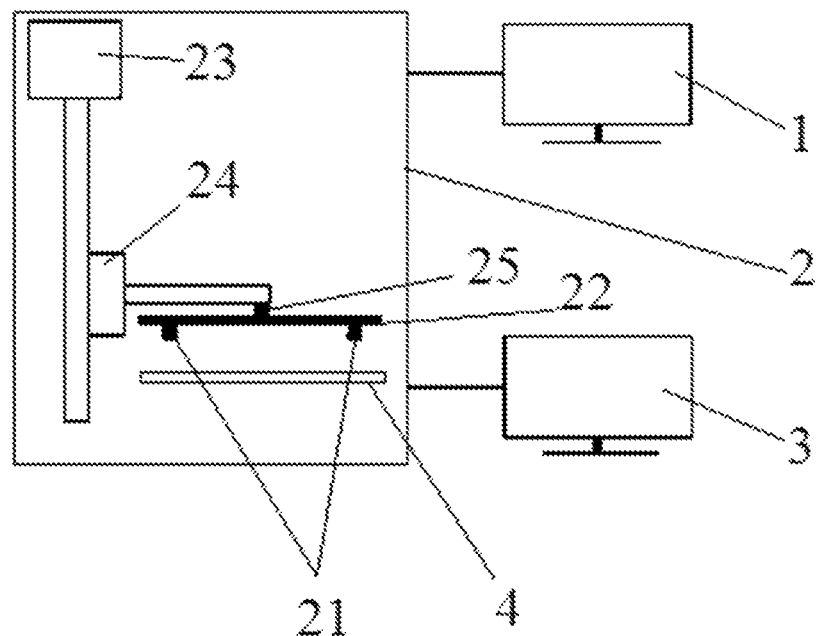
FIG. 1 illustrates a schematic structural view of an overlay alignment detection apparatus for a display device, according to an embodiment of the disclosure.

Exemplary embodiments of the present disclosure will be described hereinafter in detail with reference to the attached drawings, wherein the like reference numerals refer to the like elements. The present disclosure may, however, be embodied in many different forms, and thus the detailed description of the embodiment of the disclosure in view of attached drawings should not be construed as being limited to the embodiment set forth herein; rather, these embodiments are provided so that the present disclosure will be thorough and complete, and will fully convey the general concept of the disclosure to those skilled in the art.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

According to a general technical concept of the present disclosure, there is provided an overlay alignment detection apparatus for a display device, comprising a bearing frame for bearing the display device, a control device, a detection device and an analysis device, wherein, the control device is configured to send control commands to the detection device depending on pre-stored coordinate information of a reference point within an overlay area of the display device when the bearing frame is at an idle time among processes; the detection device is configured to be moved to the overlay area of the display device on the bearing frame according to the control commands sent by the control device, to acquire images of the overlay area, and to send the acquired images to the analysis device; and the analysis device is configured to analyze and process an overlay alignment condition of the display device, with the images sent by the detection device.

FIG. 1 illustrates a schematic structural view of an overlay alignment detection apparatus for a display device, according to an embodiment of the disclosure. Referring to FIG. 1, the overlay alignment detection apparatus for the display device is used for detecting the overlay accuracies of the various layers of membrane material during the manufacturing process of the display device. Typically, after the first layer of metal membrane material is prepared on the glass substrate, a reference mark (e.g., a reference mark in a form of a square shape or a box shape) is provided on the first layer of the metal membrane material. Then, the relative position between a peripheral frame of each layer of membrane material formed sequentially and the reference mark is detected, so as to determine whether the overlay accuracy of such layer of membrane material is qualified. The overlay alignment detection apparatus provided by the embodiment of the disclosure may determine a relative position relationship between the peripheral frame of each layer of membrane material and the reference mark on the first layer of metal membrane material intuitively, by acquiring an image (e.g., photo or video snapshot) of an overlay area of the various layers of membrane material, i.e., the image at a position where the reference mark on the first layer of the metal membrane material and the peripheral frame of membrane material are located, hereby determining whether the overlay accuracy of the layer of membrane material is qualified, without measuring critical dimensions of the display device, such that a detection efficiency may be enhanced, a comprehensive detection may be implemented on all display devices to be detected, resulting in an enhanced monitoring level and an improved product quality.

Specifically, the overlay alignment detection apparatus for a display device, according to an embodiment of the disclosure, for example, comprises a bearing frame 4 for bearing the display device, a control device 1, a detection device 2 and an analysis device 3.

In an embodiment of the disclosure, the control device 1 is used to send control commands to the detection device 2 depending on pre-stored coordinate information of a reference point within an overlay area of the display device when the bearing frame 4 is at an idle time among processes.

Figure 2:
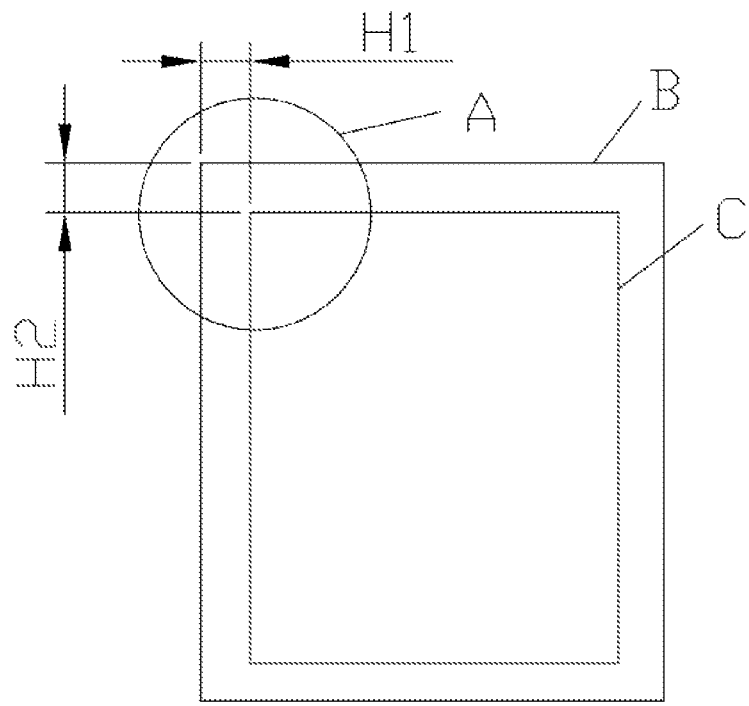
FIG. 2 illustrates a schematic view of an overlay area of the display device, according to an embodiment of the disclosure.

FIG. 2 illustrates a schematic view of an overlay area of the display device, according to an embodiment of the disclosure. By way of example, as illustrated in FIG. 2, the overlay area of the display device refers to an area which comprises at least one portion of both the peripheral frame C of the membrane material within the layer to be detected and the reference mark B (e.g., a peripheral frame of the first layer of metal membrane material) simultaneously, i.e., an area within which at least one portion of both the peripheral frame C of the membrane material within the layer to be detected and the reference mark B may be displayed in a same field of view, e.g., the area A illustrated in FIG. 2. The coordinate information of the reference point within the overlay area means that, within an area (i.e., the overlay area) which comprises at least one portion of both the peripheral frame C of the membrane material within the layer to be detected and the reference mark B, a point is selected as a reference point, and related coordinate information of the reference point in a coordinate system defined within the bearing frame 4 is the coordinate information of a reference point within the overlay area, e.g., a central point of the pattern of the reference mark B can be selected as the reference point, related coordinate information of the reference point in a coordinate system defined within the bearing frame 4 (i.e., the coordinate information of a reference point within the overlay area) is pre-stored in the control device 1. The control device 1 executes calculations on the basis of the coordinate information of the reference point so as to obtain a movement path to be traveled through by the detection device 2, and sends control commands to the detection device 2 so as to control the movement thereof. The control device 1 is for example a microprocessor of a computer, a PLC or the like.

In an embodiment of the disclosure, the detection device 2 is used to move to the overlay area of the display device on the bearing frame 4 on the basis of the control commands of the control device 1, to acquire images of the overlay area, and to send the acquired images to the analysis device 3. The "image(s)" herein refers to photo(s) or video snapshot(s) which may show the position where the reference mark and the peripheral frame of the membrane material are located so as to determine the relative position condition between the reference mark and the peripheral frame of the membrane material in the light of the photo(s) or video snapshot(s), and to further determine whether the overlay accuracies of the various layers of the membrane material are qualified on the basis thereof. By way of example, as illustrated in FIG. 2, the area A is the overlay area of the display device, in which two adjacent sides of the peripheral frame (labeled by C) are parallel to corresponding two adjacent sides of the reference mark B respectively, with a certain space existing therebetween, i.e., spaces H1 and H2. The smaller the two spaces are, the higher the registration level between the membrane material and the first layer of the metal membrane material is; on the contrary, the larger the two spaces are, the lower the registration level between the membrane material and the first layer of the metal membrane material is. On the basis thereof, it can be determined whether the overlay accuracy of the membrane material is qualified, e.g., by determining whether the spaces H1 and H2 fall within the preset threshold range.

In an embodiment of the disclosure, by way of example, the analysis device 3 is used to display the acquired images by the detection device 2 for determining the overlay alignment condition of the display device by visual inspection of people. The analysis device 3 is for example apparatus having display function, such as computer, display screen, and so on. An operator may intuitively and visually determine whether the overlay accuracies of the various layers of membrane material of the display device are qualified by observing the overlay alignment conditions of the various layers of membrane material displayed by the image(s), and send the unqualified display device to a reworking process timely such that the qualified display devices may be processed by subsequent processes. Since the detection of the overlay alignment condition of the various layers of membrane material of an individual display device has a higher efficiency and a lower time consumption, then a comprehensive detection may be implemented on all display devices to be detected, resulting in an enhanced monitoring level, an effective control/limitation of occurrence of unfavorable conditions related to the overlay accuracy, and in turn an improved product quality.

In an embodiment of the disclosure, above analysis device 3 displays images for determining the overlay alignment condition of the display device, but the disclosure is not limited thereto. In practical application, the analysis device 3 is for example a microprocessor of a computer, a PLC or the like. Once the analysis device 3 receives an image sent by the detection device 2, it implements automatically a comparison between the received images and an overlay standard image stored in the display device and hereby determines the overlay alignment condition of the display device in the light of the results of the comparison. Said "overlay standard image" of the display device refers to an image which has all the overlay accuracies of the various layers of membrane material being qualified and may be pre-stored in the analysis device 3. The analysis device 3 is used to implement a comparison between the images captured by the detection device 2 and the overlay standard image stored in the display device and to determine the overlay alignment condition of the display device on the basis of the results of the comparison. For example, the analysis device 3 carries out match of registration level by looking for central points of the image captured by the detection device 2 and the overlay standard image, and then determines the overlay alignment condition of the display device in the light of the results of the match.

Furthermore, the overlay alignment detection apparatus of an embodiment of the present disclosure further comprises, for example, an alarm device, which is used to send out an alarm prompt when the analysis device 3 determines that the overlay alignment condition of the display device is unqualified. The operator may send the corresponding display devices to a reworking process timely according to the alarm prompt and pursue subsequent processes for the display devices which fail to trigger the alarm prompt.

The specific structure of the detection device 2 according to an embodiment of the disclosure will be described in more details as follows.

Specifically, in an embodiment of the disclosure, as illustrated in FIG. 1, the detection device 2 comprises a camera 21, a mechanical arm 22, and a drive mechanism.

The camera 21 is mounted on the mechanical arm 22 for capturing the images. For example, in order to capture more clear images, the camera 21 comprises an auto-focusing device which is configured to perform auto-focusing depending on ambient light and a distance between the camera 21 and the display device.

The drive mechanism is used to drive the mechanical arm 22 to move such that the camera 21 is moved to a level above the bearing frame 4, opposite to the overlay area of the display device.

Figure 3:
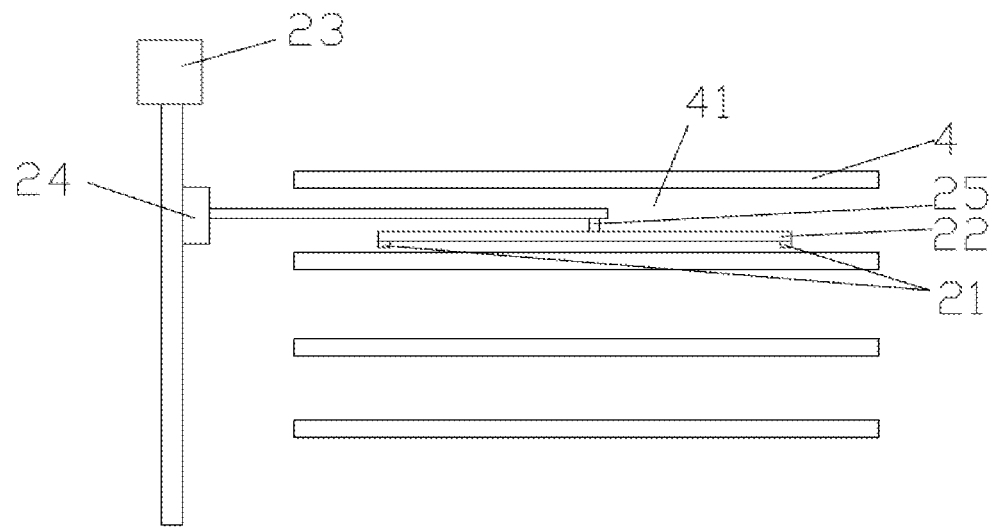
FIG. 3 illustrates a schematic structural view of the overlay alignment detection apparatus for a display device upon operation thereof, according to an embodiment of the disclosure.

In an embodiment of the disclosure, by way of example, the bearing frame 4 carries a plurality of display devices. FIG. 3 illustrates a schematic structural view of the overlay alignment detection apparatus for a display device upon operation thereof, according to an embodiment of the disclosure. Referring to FIG. 3, the bearing frame 4 comprises a plurality of layers of trays disposed to be spaced apart one another in a vertical direction, each layer being configured to carry a plurality of the display devices.

In an embodiment of the disclosure, by way of example, as illustrated in FIG. 3, the drive mechanism comprises a vertical drive assembly 23 and a horizontal drive assembly 24.

The vertical drive assembly 23 is used to drive both the horizontal drive assembly 24 and the mechanical arm 22 to move synchronously in the vertical direction. Specifically, for example, the vertical drive assembly 23 drives both the horizontal drive assembly 24 and the mechanical arm 22 to move in the vertical direction to a level corresponding to a gap 41 between any two adjacent layers of trays.

The horizontal drive assembly 24 is used to drive the mechanical arm 22 to move in a horizontal direction. Specifically, for example, the horizontal drive assembly 24 drives the mechanical arm 22 to move in the horizontal direction into the gap 41 between any two adjacent layers of trays and located to be opposite to the overlay area of the display device, when both the horizontal drive assembly 24 and the mechanical arm 22 are located at a level corresponding to the gap 41. For example, the horizontal drive assembly 24 drives the mechanical arm 22 in motion in a screw-in or screw-out manner, i.e., the mechanical arm 22 enters into and exits from the gap 41 in a rotational movement and moves horizontally within the gap 41. Alternatively, the horizontal drive assembly 24 drives the mechanical arm 22 in motion in a stretching or retracting manner, i.e., the mechanical arm 22 enters into and exits from the gap in a linear displacement and moves horizontally within the gap 41.

According to one or more embodiments of the disclosure, for example, the vertical drive assembly 23 comprises a lead screw and a first motor for driving the lead screw. The lead screw is disposed vertically and provided with a sliding component which is used to move linearly upon rotation of the lead screw. The horizontal drive assembly 24 and above sliding component connect with each other, and the lead screw and the sliding component fit and cooperate with each other when driven by the first motor, so as to drive the horizontal drive assembly 24 to move in the vertical direction linearly. By way of example, the horizontal drive assembly 24 specifically comprises a second motor and a driving component. In a case that the horizontal drive assembly 24 drives the mechanical arm 22 in motion in a screw-in or screw-out manner, the second motor is for example a rotary motor which drives the mechanical arm 22 to rotate in a horizontal plane by the driving component. In a case that the horizontal drive assembly 24 drives the mechanical arm 22 in motion in a stretching or retracting manner, the second motor is for example a linear motor which drives the mechanical arm 22 horizontally in a stretching or retracting manner by the driving component.

According to one or more embodiments of the disclosure, the detection device 2 comprises two cameras 21 which are spaced apart horizontally and mounted onto the mechanical arm 22, with a space therebetween conforming to another space between two adjacent display devices on each layer of the trays, such that the image of the overlay area of corresponding two display devices may be captured simultaneously by two cameras, resulting in a further enhanced detection efficiency. In this case, for example, the drive mechanism further comprises a rotary mechanism 25 which is mounted onto the horizontal drive assembly 24 and configured to drive the mechanical arm 22 to rotate within a horizontal plane. By way of example, by the rotary mechanism 25, once the two cameras 21 completes the image capture of the overlay areas of the two display devices, by actuating the mechanical arm 22 to rotate in the horizontal plane, the two cameras 21 are rotated into overlay areas of two display devices adjacent to the current display devices so as to perform image capture. In other words, by means of the rotary mechanism 25, the image capture may be carried out on the overlay areas of corresponding multiple (e.g., four or more) display devices, the horizontal drive assembly 24 maintaining inactive/stationary, such that the movement workflows of the drive mechanism is simplified and the detection efficiency is further enhanced.

In an embodiment of the disclosure, the idle time among processes is a time period during which the bearing frame is being in transit or during an awaiting process, after an exposure process while prior to an etching process. Since the exposure process has a cancelable property, i.e., it may enable the display device which has been subjected to the exposure process to return to a state before such exposure process. Therefore, for example, after the exposure process but prior to the etching process, the overlay alignment condition of the display device is detected such that unqualified display device(s) may be returned to the state before the exposure process, and be processed by a correction operation by re-implementing the overlay alignment between the membrane material and the reference mark until the overlay accuracies of the various layers of membrane material of the display device are qualified. By the cancelable property of the exposure process, a transit or a waiting time period may be chosen so as to detect the overlay alignment condition of the display device; therefore, the detection of the overlay alignment condition may be implemented without any additional manufacturing time of the display panel.

Figure 4:
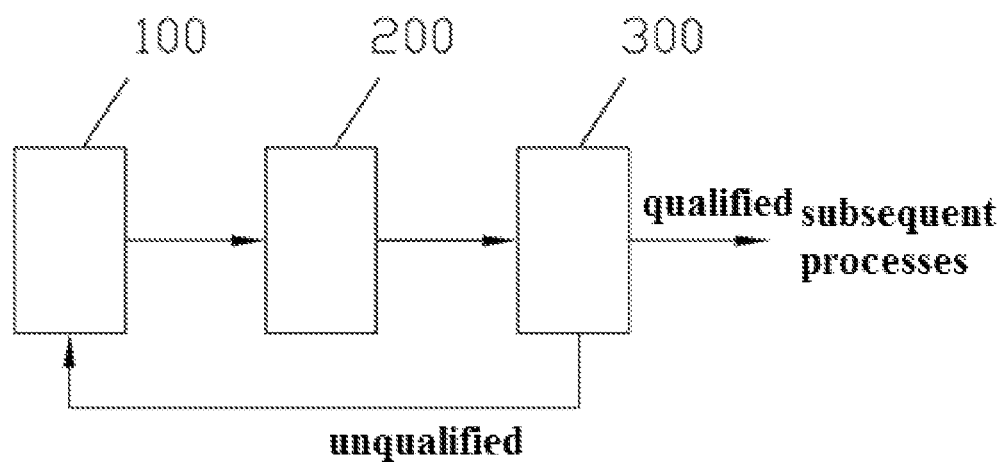
FIG. 4 illustrates a functional block diagram of the operation principle of an exposure process system, according to an embodiment of the disclosure.

FIG. 4 illustrates a functional block diagram of the operation principle of an exposure process system, according to an embodiment of the disclosure. By way of example, referring to FIG. 4, an exposure process system is further provided, comprising an exposure unit 100, a drying unit 200 and the overlay alignment detection apparatus 300. The exposure unit 100 is used to implement an exposure process on the display device. The drying unit 200 is used to dry the exposed display device. And the overlay alignment detection apparatus 300 utilizes above overlay alignment detection apparatus provided by embodiments of the disclosure, for detecting the overlay alignment condition of the dried display device.

Since the exposure process has a cancelable property, i.e., it may enable the display device which has been subjected to the exposure process to return to a state before such exposure process. Therefore, for example, after the exposure process but prior to the etching process, the overlay alignment condition of the display device is detected by the overlay alignment detection apparatus 300, such that unqualified display device(s) may be returned to the state before the exposure process, and processed by a correction operation by re-implementing the overlay alignment between the membrane material and the reference mark until the overlay accuracies of the various layers of membrane material of the display device are qualified, and then proceeded with subsequent processes. A transit direction of the display device is illustrated by the arrow in FIG. 4.

The exposure process system provided by embodiments of the disclosure enhances the detection efficiency by taking advantage of the overlay alignment detection apparatus for the display device as provided by above embodiments of the disclosure, such that a comprehensive detection may be implemented on all display devices to be detected and product quality thereof may also be improved.

It should be appreciated for those skilled in this art that the above embodiments are intended to be illustrated, and not restrictive. For example, many modifications may be made to the above embodiments by those skilled in this art, and various features described in different embodiments may be freely combined with each other without conflicting in configuration or principle. Although several exemplary embodiments of the general concept of the present application have been shown and described, it would be appreciated by those skilled in the art that various changes or modifications may be made in these embodiments without departing from the principles and spirit of the disclosure, the scope of which is defined in the claims and their equivalents.

It should be noted that the terms, such as "comprising", "including" or "having", should be understood as not excluding other elements or steps and the word "a" or "an" should be understood as not excluding plural of said elements or steps. Further, any reference number in claims should be understood as not limiting the scope of the present application.

What is claimed is:

1. An overlay alignment detection apparatus for a display device, the overlay alignment detection apparatus being configured to detect overlay accuracies of various layers of membrane material of the display device during the manufacturing process of the display device, and comprising a bearing frame for bearing the display device, a control circuit, a detection assembly and an analysis circuit, wherein, the control circuit is configured to send control commands to the detection assembly depending on pre-stored coordinate information of a reference point within an overlay area of the display device in response to the bearing frame being at an idle time among processes, the overlay area referring to an area which comprises at least one portion of both a peripheral frame of the membrane material within the layer to be detected and the reference mark provided on a first layer of metal membrane material prepared earliest in the display device, and the coordinate information of the reference point meaning that related coordinate information of a reference point, which is a point selected in the overlay area, in a coordinate system defined within the bearing frame;

the detection assembly is configured to be moved to the overlay area of the display device on the bearing frame according to the control commands sent by the control circuit, to acquire images of the overlay area, and to send the acquired images to the analysis circuit, the images referring to photos or video snapshots showing positions where the reference mark and the peripheral frame of the membrane material are located, and functioning as a basis for determining a relative position condition between the reference mark and the peripheral frame of the membrane material; and the analysis circuit is configured to analyze and process an overlay alignment condition of the display device, with the images sent by the detection assembly, and wherein the idle time among processes is a time period during which the bearing frame is in transit or during an awaiting process, after an exposure process prior to an etching process;

wherein the detection assembly comprises:
   a mechanical arm,
   a camera which is mounted on the mechanical arm and acquires the images; and
   a drive mechanism configured to drive the mechanical arm to move such that the camera is moved to a level above the bearing frame, opposite to the overlay area of the display device, the drive mechanism comprising:
      a horizontal drive assembly configured to drive the mechanical arm to move in a horizontal plane; and
      a vertical drive assembly configured to drive both the horizontal drive assembly and the mechanical arm to move synchronously only in a vertical direction, wherein the bearing frame comprises a plurality of layers of trays disposed to be spaced apart one another in a vertical direction, each layer of which is configured to carry a plurality of display devices.

2. The overlay alignment detection apparatus according to claim 1,
   wherein the analysis circuit is configured to display the images for determining the overlay alignment condition of the display device by visual inspection.

3. The overlay alignment detection apparatus according to claim 1,
   wherein the analysis circuit is configured to implement a comparison between the images and an overlay standard image stored in the display device and to determine the overlay alignment condition of the display device on the basis of a result of the comparison.

4. The overlay alignment detection apparatus according to claim 3, further comprising an alarm circuit, which is configured to send out an alarm prompt in response to the overlay alignment condition of the display device being determined by the analysis circuit to be unqualified.

5. The overlay alignment detection apparatus according to claim 1,
wherein the camera comprises an auto-focusing circuit configured to control auto-focusing depending on ambient light and a distance between the camera and the display device.

6. The overlay alignment detection apparatus according to claim 1,
wherein the horizontal drive assembly drives the mechanical arm to move in the horizontal direction into a gap between any two adjacent layers of trays and located to be opposite to the overlay area of the display device, in response to both the horizontal drive assembly and the mechanical arm being driven by the vertical drive assembly to move in the vertical direction to a level corresponding to the gap.

7. The overlay alignment detection apparatus according to claim 6,
wherein the horizontal drive assembly drives the mechanical arm in motion in a screw-in or screw-out manner, or the vertical drive assembly drives the mechanical arm in motion in a stretching or retracting manner.

8. The overlay alignment detection apparatus according to claim 1,
wherein the drive mechanism further configured to drive the mechanical arm to rotate within a horizontal plane.

9. The overlay alignment detection apparatus according to claim 8,
wherein the detection assembly comprises two cameras which are spaced apart horizontally and mounted onto the mechanical arm, with a space therebetween conforming to another space between two adjacent display devices on each layer of the trays.

10. An exposure process system, comprising the overlay alignment detection apparatus according to claim 1, wherein the overlay alignment detection apparatus is configured to detect the overlay alignment condition of the display device after drying.

11. An overlay alignment detection apparatus for a display device, the overlay alignment detection apparatus being configured to detect overlay accuracies of various layers of membrane material of the display device during the manufacturing process of the display device, and comprising a bearing frame for bearing the display device, a control circuit, a detection assembly and an analysis circuit, wherein,
the control circuit is configured to send control commands to the detection assembly depending on pre-stored coordinate information of a reference point within an overlay area of the display device in response to the bearing frame being at an idle time among processes, the overlay area referring to an area which comprises at least one portion of both a peripheral frame of the membrane material within the layer to be detected and the reference mark provided on a first layer of metal membrane material prepared earliest in the display device, and the coordinate information of the reference point meaning that related coordinate information of a reference point, which is a point selected in the overlay area, in a coordinate system defined within the bearing frame;
the detection assembly is configured to be moved to the overlay area of the display device on the bearing frame according to the control commands sent by the control circuit, to acquire images of the overlay area, and to send the acquired images to the analysis circuit, the images referring to photos or video snapshots showing positions where the reference mark and the peripheral frame of the membrane material are located, and functioning as a basis for determining a relative position condition between the reference mark and the peripheral frame of the membrane material; and
the analysis circuit is configured to analyze and process an overlay alignment condition of the display device, with the images sent by the detection assembly, and
wherein the idle time among processes is a time period during which the bearing frame is in transit or during an awaiting process, after an exposure process prior to an etching process;
wherein the detection assembly comprises:
a mechanical arm,
a camera which is mounted on the mechanical arm and acquires the images; and
a drive mechanism configured to drive the mechanical arm to move such that the camera is moved to a level above the bearing frame, opposite to the overlay area of the display device, the drive mechanism comprising:
a horizontal drive assembly configured to drive the mechanical arm to move in a horizontal direction; and
a vertical drive assembly configured to drive both the horizontal drive assembly and the mechanical arm to move synchronously in a vertical direction,
wherein the bearing frame comprises a plurality of layers of trays disposed to be spaced apart one another in a vertical direction, each layer of which is configured to carry a plurality of display devices.

* * * * *